(12) United States Patent
Wang et al.

(10) Patent No.: US 10,209,282 B2
(45) Date of Patent: Feb. 19, 2019

(54) REMOTE MONITORING SYSTEM AND METHOD FOR ELECTRICITY DEMAND OF FUSED MAGNESIUM FURNACE GROUP

(71) Applicant: Northeastern University, Shenyang, Liaoning Province (CN)

(72) Inventors: Liangyong Wang, Shenyang (CN); Jie Yang, Shenyang (CN); Tianyou Chai, Shenyang (CN); Shaowen Lu, Shenyang (CN)

(73) Assignee: NORTHEASTERN UNIVERSITY, Shenyang, Liaoning Province (CN)

( * ) Notice: Subject to any disclaimer, the term of this patent is extended or adjusted under 35 U.S.C. 154(b) by 58 days.

(21) Appl. No.: 15/528,747

(22) PCT Filed: Dec. 3, 2015

(86) PCT No.: PCT/CN2015/096254
§ 371 (c)(1),
(2) Date: May 22, 2017

(87) PCT Pub. No.: WO2016/095703
PCT Pub. Date: Jun. 23, 2016

(65) Prior Publication Data
US 2017/0315163 A1 Nov. 2, 2017

(30) Foreign Application Priority Data
Dec. 18, 2014 (CN) .......................... 2014 1 0787851

(51) Int. Cl.
*G01R 21/133* (2006.01)
*G01R 21/06* (2006.01)
*G01R 19/25* (2006.01)
(52) U.S. Cl.
CPC ....... *G01R 21/133* (2013.01); *G01R 19/2516* (2013.01); *G01R 21/06* (2013.01)

(58) Field of Classification Search
USPC ........................................................ 702/62
See application file for complete search history.

(56) References Cited

U.S. PATENT DOCUMENTS 6,411,643 B1 * 6/2002 Schreiter ................ H05B 7/148
373/104
6,618,648 B1 * 9/2003 Shirota ................ G01R 31/088
700/286

(Continued)

FOREIGN PATENT DOCUMENTS

CN 101825655 A 9/2010
CN 102478602 A 5/2012
(Continued)

*Primary Examiner* — Paul D Lee
(74) *Attorney, Agent, or Firm* — Muncy, Geissler, Olds & Lowe, P.C.

(57) ABSTRACT

A remote monitoring system and method for electricity demand of a fused magnesium furnace group. The system has a data acquisition device, a local PC, a cloud server and a remote PC. The data acquisition device has a voltage transformer, a current transformer, an active power transducer, a first slave computer, a plurality of multi-purpose electronic measuring instruments and a second slave computer. The method includes acquiring smelting current and smelting power of each fused magnesium furnace and electricity demand of the furnace group, controlling the switch off/on of each fused magnesium furnace according to the smelting current and the smelting power of each fused magnesium furnace and the electricity demand of the furnace group, sending basic monitoring data to the local PC, and achieving data exchange between the local PC and the remote PC through the Zookeeper technology.

9 Claims, 11 Drawing Sheets

(56) References Cited

U.S. PATENT DOCUMENTS

| | | | | |
|---|---|---|---|---|
| 8,185,356 B2 * | 5/2012 | Mukaigawa | ............. | H04Q 9/00 |
| | | | | 702/112 |
| 8,860,242 B1 * | 10/2014 | Pruett | ...................... | H02J 4/00 |
| | | | | 307/5 |
| 2002/0143482 A1 | 10/2002 | Karanam et al. | | |

FOREIGN PATENT DOCUMENTS

| | | | |
|---|---|---|---|
| CN | 103063911 A | | 4/2013 |
| CN | 103136895 A | | 6/2013 |
| CN | 104459306 A | | 3/2015 |
| JP | 2005-080499 A | | 3/2005 |

* cited by examiner

REMOTE MONITORING SYSTEM AND METHOD FOR ELECTRICITY DEMAND OF FUSED MAGNESIUM FURNACE GROUP

BACKGROUND OF THE INVENTION

1. Field of the Invention

The present invention belongs to the technical field of monitoring on electricity demand of energy consuming equipment, and in particular relates to a remote monitoring system and method for electricity demand of a fused magnesium furnace group.

2. The Prior Arts

Electric fused magnesium furnace is a kind of three-phase AC electric-arc furnace for smelting fused magnesia by using magnesite as a raw material. Its function is to provide the physical chemical reaction space for melting raw material under heat from high-temperature arc. MgO molten pool is formed from melting the raw material by adjusting the distance between the three-phase graphite electrodes and the surface of molten pool to form and maintain an appropriate AC arc, and the molten pool is cooled to form a crystal product. Production in a fused magnesia plant is conducted through a plurality of fused magnesium furnaces in the same time period, and such production way of the furnace group causes a large total power of a main transformer during the production.

In the whole production process, the average total power of the fused magnesium furnaces supplied by the same main transformer in the fused magnesia plant for a period of time (i.e., electricity demand of the furnace group) cannot exceed the maximum allowable demand value specified by electric network companies. Once the electricity demand of the furnace group exceeds the maximum allowable demand value, the plant will pay a high punitive electricity fee. This "excessive-demand" situation will also seriously affect the electricity supply quality and safe operation of a local electric network where the plant is located.

At present, monitoring on the electricity demand of the furnace group by fused magnesia enterprises in China is mainly conducted as local monitoring in places confined to substations within these fused magnesia enterprises, and mostly by using the manual monitoring means which not only brings intensive work for monitoring personnel, but also has low monitoring efficiency. With such manual monitoring means, managers of the fused magnesia enterprise cannot timely realize a long-distance on-line monitoring on the ongoing level of electricity demand of the furnace group, and with a low management level of the electricity demand of the furnace group, they cannot give timely and effective remote guidance on the production (Design and Development of Remote Monitoring System Platform for Electricity Demand of Fused Magnesia Group Furnace [D], Northeastern University, 2013).

SUMMARY OF THE INVENTION

In view of the shortcomings of the prior art, the present invention provides a remote monitoring system and method for electricity demand of a fused magnesium furnace group.

The present invention employs the following technical scheme:

a remote monitoring system for electricity demand of a fused magnesium furnace group, comprises a data acquisition device, a local PC, a cloud server and a remote PC, wherein the data acquisition device comprises a voltage transformer, a current transformer, an active power transducer, a first slave computer, a plurality of multi-purpose electronic measuring instruments and a second slave computer;

the voltage transformer and the current transformer are mounted in a substation, output ends of the voltage transformer and output ends of the current transformer are connected with input ends of the active power transducer, and an output end of the active power transducer is connected with an input end of the first slave computer; the multi-purpose electronic measuring instruments are mounted in the substation, an output end of each multi-purpose electronic measuring instrument is connected with an input end of the second slave computer, an output end of the second slave computer is connected with an input end of the first slave computer, an output end of the first slave computer is connected with the local PC and is also connected with switch-off relays of the fused magnesium furnaces, the local PC is connected with the cloud server through the Internet, and the cloud server is connected with the remote PC through the Internet;

the voltage transformer is used for converting three-phase high-voltage AC signals on the secondary side of the main transformer of the fused magnesium furnace group into three-phase low-voltage AC signals which can be received by the active power transducer according to a voltage ratio, and sending the low-voltage AC signals to the active power transducer;

the current transformer is used for converting A and C two-phase high-current AC signals on the secondary side of the main transformer of the fused magnesium furnace group into A and C two-phase low-current AC signals which can be received by the active power transducer according to a current ratio, and sending the signals to the active power transducer;

the active power transducer is used for converting the three-phase low-voltage AC signals and the A and C two-phase low-current AC signals into DC signals representing the power of the main transformer and sending the signals to the first slave computer;

the multi-purpose electronic measuring instruments are used for acquiring the smelting current of each fused magnesium furnace and the smelting power of each fused magnesium furnace, and sending the smelting current and the smelting power to the second slave computer;

the second slave computer is used for sending the smelting current of each fused magnesium furnace and the smelting power of each fused magnesium furnace to the first slave computer;

the first slave computer is used for: setting the demand cycle, slippage time, alternate tripping set values of electricity demand of the furnace group and all tripping set values of electricity demand of the furnace group; converting the DC signals representing the power of the main transformer according to the voltage ratio and current ratio so as to obtain the actual power value of the main transformer; conducting the sliding average calculation during the demand cycle according to the actual power value of the main transformer, to obtain electricity demand of the furnace group, and re-calculating once every other slippage time to obtain new electricity demand of the furnace group; determining the production status of each fused magnesium furnace by judging whether the smelting power of each fused magnesium furnace is zero or not, and making marks; arranging the switch-off priority of each fused magnesium furnace by comparing the sizes of the smelting current of the fused magnesium furnaces; counting the maximum electricity demand of the current month, the number of all trippings of the current month, the maximum electricity demand of the last month, and the number of all trippings of the last month; sending basic monitoring data to the local PC according to the sampling cycle; controlling the switch off/on of each fused magnesium furnace according to the smelting current of each fused magnesium furnace, the smelting power of each fused magnesium furnace, the electricity demand of the furnace group, the all tripping set values of electricity demand of the furnace group, the alternate tripping set values of electricity demand of the furnace group, set values of all tripping time and set values of switch-off time; and modifying the alternate tripping set values of electricity demand of the furnace group and all tripping set values of electricity demand of the furnace group according to demand parameter adjustment data;

the basic monitoring data include: the power of the main transformer, the smelting current of each fused magnesium furnace, the smelting power of each fused magnesium furnace, the voltage ratio, the current ratio, the demand cycle, the slippage time, the alternate tripping set values of electricity demand of the furnace group, the all tripping set values of electricity demand of the furnace group, the maximum electricity demand of the current month, the number of all trippings of the current month, the maximum electricity demand of the last month, the number of all trippings of the last month, the electricity demand of the furnace group, marks for the production status of each fused magnesium furnace, and the switch-off priority of each fused magnesium furnace;

the demand parameter adjustment data include: a timestamp, alternate tripping set values of electricity demand of the furnace group after adjustment, and all tripping set values of electricity demand of the furnace group after adjustment;

the local PC is used for: receiving the basic monitoring data from the first slave computer according to the sampling cycle; taking the timestamp at the time of acquiring the basic monitoring data and the basic monitoring data as demand monitoring data, serializing the demand monitoring data and sending the serialized data to the cloud server; receiving the serialized demand parameter adjustment data sent from the cloud server, deserializing the data, and sending the deserialized data to the first slave computer; and providing a local monitoring screen and displaying the demand monitoring data;

the local PC is provided with a local monitoring unit which comprises a local monitoring module, a local data sending module and a local data receiving module;

wherein the local monitoring module is used for taking the timestamp at the time of acquiring the basic monitoring data and the basic monitoring data as demand monitoring data, and sending the data to the local data sending module; sending the received demand parameter adjustment data to the first slave computer; and providing a local monitoring screen and displaying the demand monitoring data;

the local data sending module is used for serializing the demand monitoring data and sending the serialized data to the cloud server through the Zookeeper technology;

the local data receiving module is used for deserializing the serialized demand parameter adjustment data and sending the deserialized data to the local monitoring module;

the cloud server is used for: implementing data exchange between the local PC and the remote PC through the Zookeeper technology; receiving the serialized demand monitoring data sent from the local PC and sending the data to the remote PC; and receiving the serialized parameter adjustment data sent from the remote PC and sending the data to the local PC;

the cloud server comprises two Znode nodes: Znode node A and Znode node B, wherein Znode node A is used for sending the serialized demand monitoring data to the remote PC through the Zookeeper technology;

and Znode node B is used for sending the serialized demand parameter adjustment data to the local PC through the Zookeeper technology;

the remote PC is used for deserializing the serialized demand monitoring data sent from the cloud server, providing a remote monitoring screen, displaying the demand monitoring data, serializing the demand parameter adjustment data and sending the serialized data to the cloud server;

the remote PC is provided with a remote monitoring unit which comprises a remote monitoring module, a remote data sending module and a remote data receiving module;

wherein the remote monitoring module is used for providing the remote monitoring screen, displaying the demand monitoring data, determining the demand parameter adjustment data, and sending the determined the data to the remote data sending module;

the remote data sending module is used for serializing the demand parameter adjustment data and sending the serialized demand parameter adjustment data to the cloud server through the Zookeeper technology;

the remote data receiving module is used for deserializing the serialized demand monitoring data and then sending the data to the remote monitoring module.

A remote monitoring method for electricity demand of the fused magnesium furnace group by using the remote monitoring system for electricity demand of the fused magnesium furnace group, comprises the following steps:

step 1: acquiring the smelting currents of the fused magnesium furnaces, the smelting power of each fused magnesium furnaces and the power of the main transformer;

step 1.1: acquiring the smelting current of each fused magnesium furnace and the smelting power of each fused magnesium furnace, and sending the smelting current and the smelting power to the second slave computer by the multi-purpose electronic measuring instruments;

step 1.2: sending the smelting current of each fused magnesium furnace and the smelting power of each fused magnesium furnace to the first slave computer by the second slave computer;

step 1.3: converting the three-phase high-voltage AC signals on the secondary side of the main transformer of the fused magnesium furnace group into three-phase low-voltage AC signals which can be received by the active power transducer by the voltage transformer according to a voltage ratio; converting the A and C two-phase high-current AC signals on the secondary side of the main transformer of the fused magnesium furnace group into A and C two-phase low-current AC signals which can be received by the active power transducer by the current transformer according to a current ratio; sending the low-voltage AC signals and low-current AC signals to the active power transducer; and step 1.4: converting the three-phase low-voltage AC signals and the A and C two-phase low-current AC signals into DC signals representing the power of the main transformer and sending the signals to the first slave computer by the active power transducer;

step 2: setting the demand cycle and the slippage time, wherein the first slave computer converts the DC signals representing the power of the main transformer according to the voltage ratio and current ratio to obtain the actual power value of the main transformer, and conducting the calculation according to the demand cycle and the slippage time to obtain the electricity demand of the furnace group;

step 3: controlling the switch off/on of each fused magnesium furnace by the first slave computer according to the smelting current of each fused magnesium furnace, the smelting power of each fused magnesium furnace, the electricity demand of the furnace group, the all tripping set values of electricity demand of the furnace group, the alternate tripping set values of electricity demand of the furnace group, the set values of all tripping time and the set values of switch-off time;

step 3.1: determining the production status of each fused magnesium furnace by judging whether the smelting power of each fused magnesium furnace is zero or not, and making marks;

step 3.2: determining the switch-off priority of each fused magnesium furnace: arranging the switch-off priority of each fused magnesium furnace by comparing the sizes of the smelting currents of the fused magnesium furnaces, wherein the fused magnesium furnace with higher smelting current has higher priority;

step 3.3: judging whether the current electricity demand of the furnace group exceeds the all tripping set values of electricity demand of the furnace group or not; if yes, conducting all tripping operation of the fused magnesium furnaces, that is, switching off all the fused magnesium furnaces and executing step 3.4; else, executing step 3.5;

step 3.4: when the all tripping operation time reaches the set values of all tripping time, restoring all the fused magnesium furnaces to the switch-on state and returning to step 3.3;

step 3.5: judging whether the current electricity demand of the furnace group exceeds the alternate tripping set values of electricity demand of the furnace group or not; if yes, executing step 3.6; else, executing step 3.12;

step 3.6: determining the fused magnesium furnace with the highest priority as the fused magnesium furnace to be switched off, and executing step 3.7;

step 3.7: switching off the fused magnesium furnace determined to be switched off;

step 3.8: when the switch-off time reaches set values of switch-off time, switching on the fused magnesium furnace which is currently in the switch-off state;

step 3.9: judging whether the current electricity demand of the furnace group exceeds the alternate tripping set values of electricity demand of the furnace group or not; if yes, executing step 3.10; else, executing step 3.12;

step 3.10: judging whether the fused magnesium furnace previously in the switch-off state is the fused magnesium furnace with the lowest priority or not; if yes, returning to step 3.6; else, executing step 3.11;

step 3.11: determining the fused magnesium furnace with the priority being one level lower than that of the fused magnesium furnace previously in the switch-off state as the fused magnesium furnace to be switched off, and returning to step 3.7; and step 3.12: ending the alternate tripping, and returning to step 3.3;

Step 4: counting the maximum electricity demand of the current month, the number of all trippings of the current month, the maximum electricity demand of the last month, and the number of all trippings of the last month by the first slave computer;

step 5: sending the basic monitoring data to the local PC by the first slave computer according to a sampling cycle;

step 6: taking the timestamp at the time of acquiring the basic monitoring data and the basic monitoring data as demand monitoring data by the local PC, and sending the data to the remote PC by the cloud server through the Zookeeper technology, wherein the remote PC provides the remote monitoring screen and displays the demand monitoring data;

step 7: when remote monitoring personnel modify the demand parameter adjustment data, sending the demand parameter adjustment data to the first slave computer through the Zookeeper technology by the remote PC; and step 8: modifying the alternate tripping set values of electricity demand of the furnace group and the all tripping set values of electricity demand of the furnace group by the first slave computer according to demand parameter adjustment data, and returning to step 1.

The present invention has the advantages that, the present invention provides a remote monitoring system and method for electricity demand of a fused magnesium furnace group, which offer convenience for enterprise management personnel to carry out monitoring and production guidance at a remote place, and offer convenient for researchers to use the electricity demand in mathematical analysis and modeling, to propose better demand adjustment methods. The system and method can not only help fused magnesium enterprises to reduce production costs and increase yield of fused magnesia production so as to improve economic efficiency, but also reduce the load impact on the electric network by the electricity demand of the fused magnesium furnace group, so as to narrow the peak-valley difference of the electric network.

BRIEF DESCRIPTION OF THE DRAWINGS

FIG. 5 is a flow diagram of the local PC sending the serialized demand monitoring data to the remote PC via Znode node A of the cloud server through the Zookeeper technology in detailed description of the present invention; and FIG. 6 is a flow diagram of the remote PC sending the serialized demand parameter adjustment data to the remote PC via Znode node B of the cloud server through the Zookeeper technology in detailed description of the present invention.

DETAILED DESCRIPTION OF THE PREFERRED EMBODIMENT

Figure 1A:
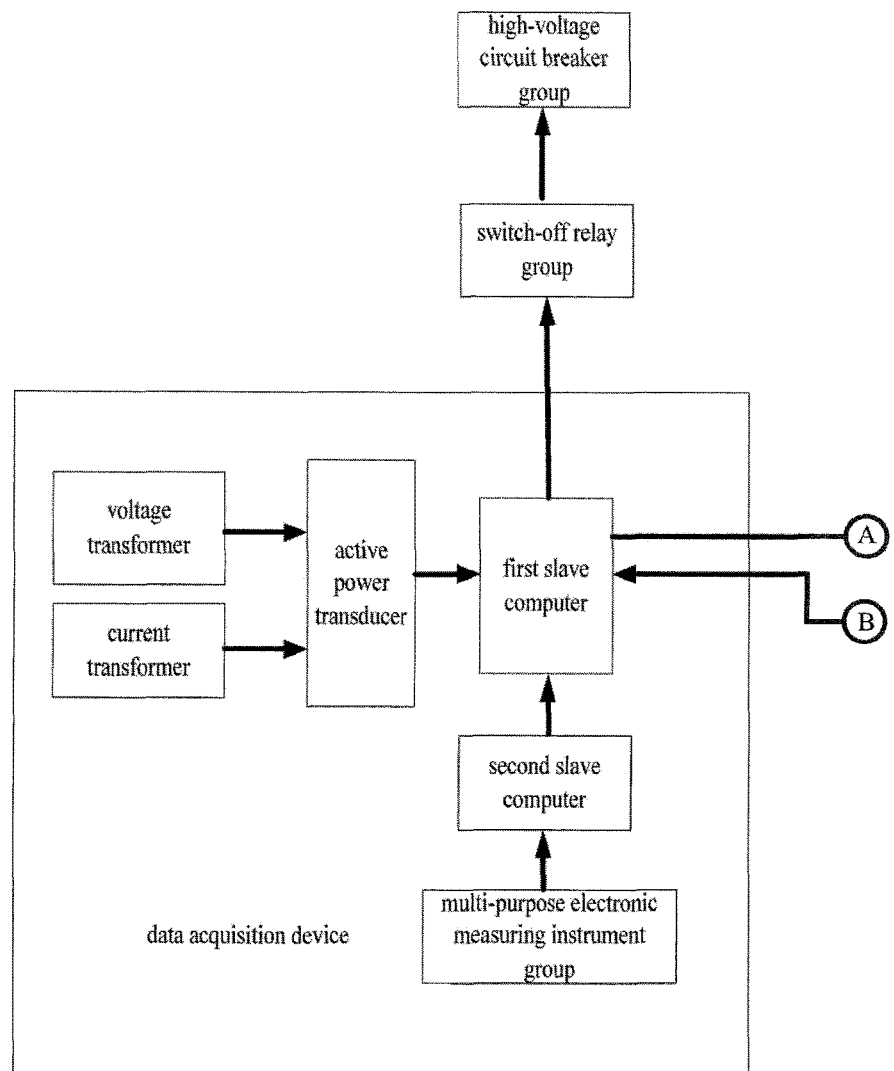
FIGS. 1A and 1B are a structural block diagram of the remote monitoring system for electricity demand of a fused magnesium furnace group in detailed description of the present invention.
Figure 1B:
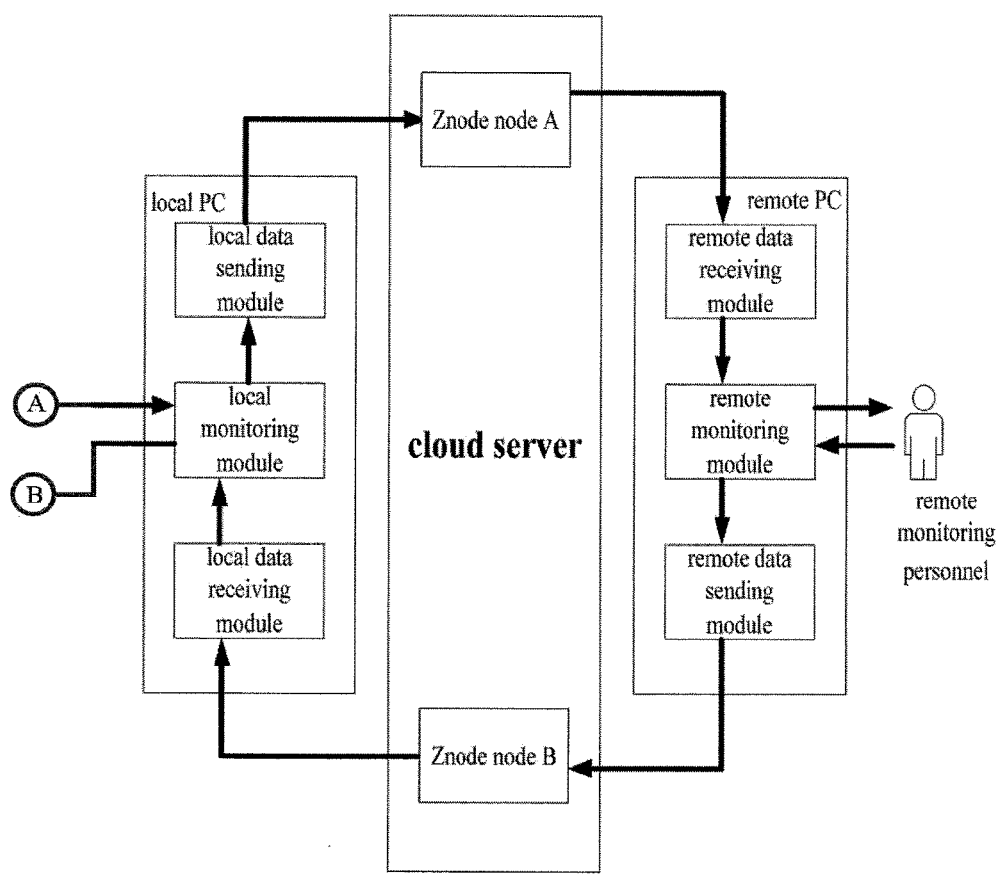
Figure 2A:
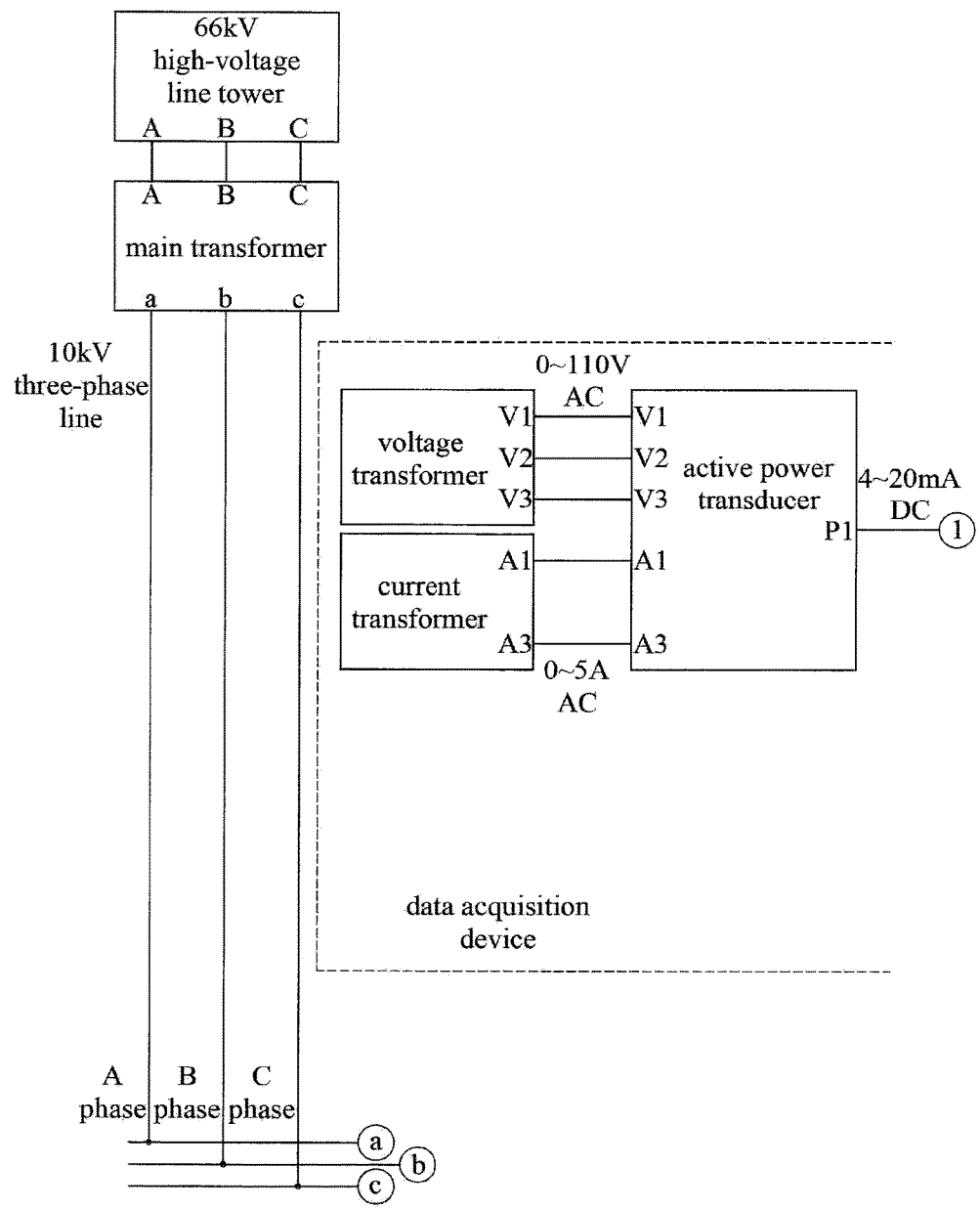
FIGS. 2A-2D are a linking diagram of the remote monitoring system for electricity demand of a fused magnesium furnace group in detailed description of the present invention.
Figure 2B:
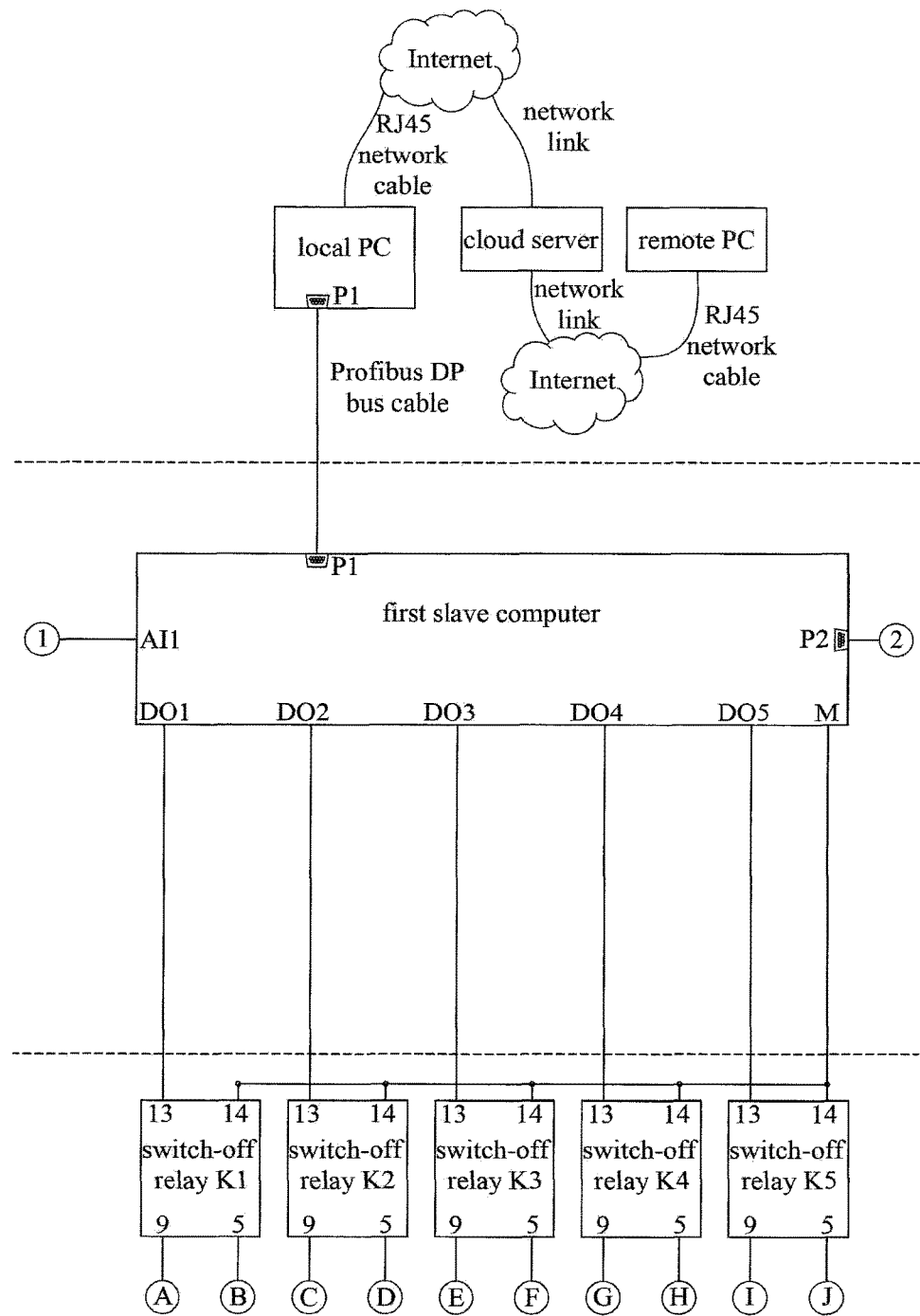
Figure 2C:
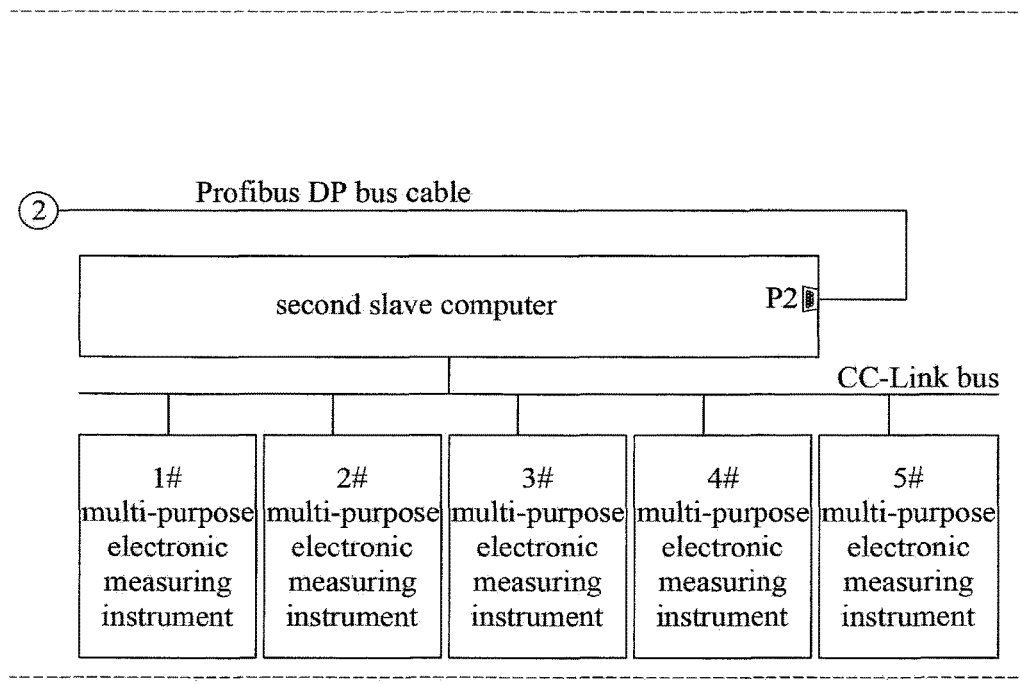
Figure 2D:
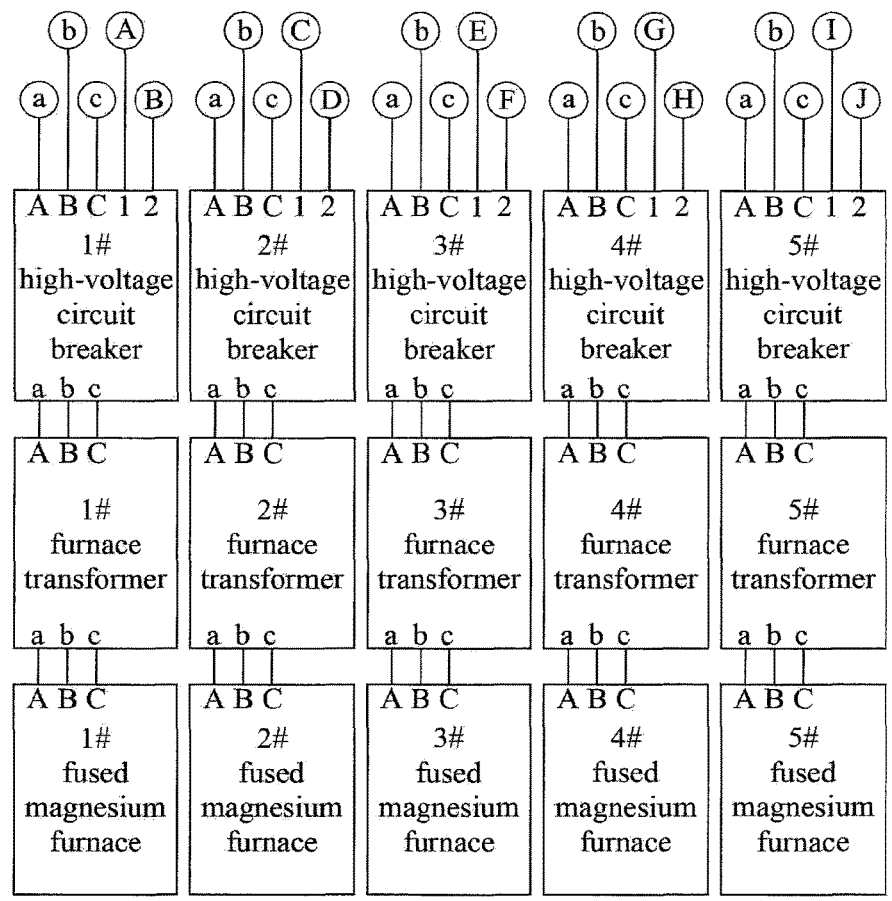

A remote monitoring system for electricity demand of a fused magnesium furnace group, as shown in FIGS. 1A and 1B, comprises a data acquisition device, a local PC, a cloud server and a remote PC.

In this implementation, the selected local PC is the model of Advantech IPC-610L; the selected cloud server is a cloud server with the operating system of CentOS 6.5; and the selected remote PC is the model of Dell Optiplex790.

The data acquisition device comprises a voltage transformer, a current transformer, an active power transducer, a first slave computer, a plurality of multi-purpose electronic measuring instruments and a second slave computer.

In this implementation, the selected voltage transformer is the model of JSZW3-10, with the voltage ratio of 100:1;

the selected current transformer is the model of LFZBJ-10, with the current ratio of 400:1;

a three-phase three-wire active power transducer in the model of YDD-P3 is selected;

Siemens 57-200PLC is selected as the first slave computer;

Mitsubishi Q series PLC with the CPU of model Q03UD is selected as the second slave computer; and five multi-purpose electronic measuring instruments in the model of ME96NSR are selected.

A linking diagram of the remote monitoring system for electricity demand of a fused magnesium furnace group is shown in FIGS. 2A-2D. In this implementation, the voltage transformer and the current transformer are mounted in a substation, the output ends V1, V2, V3 of the voltage transformer for A, B, C three-phase voltage AC signals are connected with the input ends V1, V2, V3 of the active power transducer, the output ends A1, A3 of the current transformer for A, B, two-phase current AC signals are connected with the input ends A1, A3 of the active power transducer, the output end P1 of the active power transducer is connected with the input end AI1 of the first slave computer for analog signals, and the active power transducer outputs DC analog signals of 4-20 mA; the five multi-purpose electronic measuring instruments are mounted in the substation, and each is connected with the input end of the second slave computer through a CC-Link bus, a serial port P2 of the second slave computer is connected with a serial port P2 of the first slave computer through a Profibus DP bus cable, and a serial port P1 of the first slave computer is connected with a serial port P1 of the local PC through a Profibus DP bus cable and communicates based on the OPC standard protocol.

In this implementation, the DO1 pin of the first slave computer is connected with the 13th pin of a switch-off relay K1, the DO2 pin of the first slave computer is connected with the 13th pin of a switch-off relay K2, the DO3 pin of the first slave computer is connected with the 13th pin of a switch-off relay K3, the DO4 pin of the first slave computer is connected with the 13th pin of a switch-off relay K4, and the DO5 pin of the first slave computer is connected with the 13th pin of a switch-off relay K5. the 14th pin of the switch-off relay K1, the 14th pin of the switch-off relay K2, the 14th pin of the switch-off relay K3, the 14th pin of the switch-off relay K4, and the 14th pin of the switch-off relay K5 are all connected with the M pin of the first slave computer; the 9th pin of the switch-off relay K1 is connected with the 1st pin of a 1# high-voltage circuit breaker, and the 5th pin of the switch-off relay K1 is connected with the 2nd pin of the 1# high-voltage circuit breaker; the 9th pin of the switch-off relay K2 is connected with the 1st pin of a 2# high-voltage circuit breaker, and the 5th pin of the switch-off relay K2 is connected with the 2nd pin of the 2# high-voltage circuit breaker; the 9th pin of the switch-off relay K3 is connected with the 1st pin of a 3# high-voltage circuit breaker, and the 5th pin of the switch-off relay K3 is connected with the 2nd pin of the 3# high-voltage circuit breaker; the 9th pin of the switch-off relay K4 is connected with the 1st pin of a 4# high-voltage circuit breaker, and the 5th pin of the switch-off relay K4 is connected with the 2nd pin of the 4# high-voltage circuit breaker; the 9th pin of the switch-off relay K5 is connected with the 1st pin of a 5# high-voltage circuit breaker, and the 5th pin of the switch-off relay K5 is connected with the 2nd pin of the 5# high-voltage circuit breaker.

In this implementation, output ends a, b, c of a high-voltage line tower are respectively connected with input ends A, B, C of the main transformer; output ends a, b, c of the main transformer are respectively connected with input ends A, B, C of the 1# high-voltage circuit breaker, input ends A, B, C of the 2# high-voltage circuit breaker, input ends A, B, C of the 3# high-voltage circuit breaker, input ends A, B, C of the 4# high-voltage circuit breaker, and input ends A, B, C of the 5# high-voltage circuit breaker; output ends a, b, c of the 1# high-voltage circuit breaker are respectively connected with input ends A, B, C of a 1# furnace transformer; output ends a, b, c of the 2# high-voltage circuit breaker are respectively connected with input ends A, B, C of a 2# furnace transformer; output ends a, b, c of the 3# high-voltage circuit breaker are respectively connected with input ends A, B, C of a 3# furnace transformer; output ends a, b, c of the 4# high-voltage circuit breaker are respectively connected with input ends A, B, C of a 4# furnace transformer; output ends a, b, c of the 5# high-voltage circuit breaker are respectively connected with input ends A, B, C of a 5# furnace transformer; output ends a, b, c of the 1# furnace transformer are respectively connected with input ends A, B, C of a 1# fused magnesium furnace; output ends a, b, c of the 2# furnace transformer are respectively connected with input ends A, B, C of a 2# fused magnesium furnace; output ends a, b, c of the 3# furnace transformer are respectively connected with input ends A, B, C of a 3# fused magnesium furnace; output ends a, b, c of the 4# furnace transformer are respectively connected with input ends A, B, C of a 4# fused magnesium furnace; output ends a, b, c of the 5# furnace transformer are respectively connected with input ends A, B, C of a 5# fused magnesium furnace.

The local PC is connected with the cloud server through the Internet, and the cloud server is connected with the remote PC through the Internet.

In this implementation, the voltage transformer of model SZW3-10 is used for converting the three-phase high-voltage AC signals on the secondary side of the main transformer of the fused magnesium furnace group into three-phase low-voltage AC signals (in the range of 0-110V) which can be received by the active power transducer according to a voltage ratio of 100:1, and sending the low-voltage AC signals to the active power transducer.

In this implementation, the current transformer of model LFZBJ-10 is used for converting the A and C two-phase high-current AC signals at the secondary side of the main transformer of the fused magnesium furnace group into A and C two-phase low-current AC signals (in the range of 0-5 A) which can be received by the active power transducer according to a current ratio of 400:1, and sending the low-current AC signals to the active power transducer.

In this implementation, the three-phase three-wire active power transducer of model YDD-P3 is used for converting the three-phase low-voltage AC signals and the A and C two-phase low-current AC signals into DC signals (in the range of 4-20 mA) representing the power of the main transformer and sending the signals to the first slave computer.

In this implementation, the five multi-purpose electronic measuring instruments of model ME96NSR are used for acquiring the smelting current of each fused magnesium furnace and the smelting power of each fused magnesium furnace, and sending the smelting current and the smelting power to the second slave computer.

In this implementation, the second slave computer, the Mitsubishi Q series PLC with the CPU of model Q03UD is used for sending the smelting current of each fused magnesium furnace and the smelting power of each fused magnesium furnace to the first slave computer.

In this implementation, the first slave computer, the Siemens 57-200PLC is used for: setting the demand cycle, slippage time, alternate tripping set values of electricity demand of the furnace group and all tripping set values of electricity demand of the furnace group; converting the DC signals representing the power of the main transformer according to the voltage ratio and current ratio so as to obtain the actual power value of the main transformer; conducting the sliding average calculation during the demand cycle according to the actual power value of the main transformer, so as to obtain electricity demand of the furnace group, and re-calculating once every other slippage time to obtain new electricity demand of the furnace group; determining the production status of each fused magnesium furnace by checking whether the smelting power of each fused magnesium furnace is zero or not, and making marks; arranging the switch-off priority of each fused magnesium furnace by comparing the sizes of the smelting current of the fused magnesium furnaces; counting the maximum electricity demand of the current month, the number of all trippings of the current month, the maximum electricity demand of the last month, and the number of all trippings of the last month; sending basic monitoring data to the local PC according to a sampling cycle; controlling the switch off/on of each fused magnesium furnace according to the smelting current of each fused magnesium furnace, the smelting power of each fused magnesium furnace, the electricity demand of the furnace group, the alternate tripping set values of electricity demand of the furnace group, the all tripping set values of electricity demand of the furnace group, the set values of all tripping time and the set values of switch-off time; and modifying the demand monitoring data according to demand parameter adjustment data.

In this implementation, the demand cycle is set as 210 seconds, and the slippage time as 7 seconds.

In this implementation, the Siemens S7-200PLC determines the production status mark of each fused magnesium furnace by checking whether the smelting power of each of the five fused magnesium furnaces is zero or not: the fused magnesium furnace gets the production status mark of "ON" if the smelting power of such fused magnesium furnace is NOT zero, and the fused magnesium furnace gets the production status mark of "OFF" if the smelting power of such fused magnesium furnace is zero; the Siemens S7-200PLC arranges the switch-off priority of the five fused magnesium furnaces by comparing the sizes of the smelting current of the five fused magnesium furnaces: the fused magnesium furnace with the largest current having the level-1 switch-off priority, the fused magnesium furnace with the second largest current having the level-2 switch-off priority, the fused magnesium furnace with the third largest current having the level-3 switch-off priority, the fused magnesium furnace with the fourth largest current having the level-4 switch-off priority, and the fused magnesium furnace with the fifth largest current having the level-5 switch-off priority.

The basic monitoring data include: the power of the main transformer, the smelting current of each fused magnesium furnace, the smelting power of each fused magnesium furnace, the voltage ratio, the current ratio, the demand cycle, the slippage time, the alternate tripping set values of electricity demand of the furnace group, the all tripping set values of electricity demand of the furnace group, the maximum electricity demand of the current month, the number of all trippings of the current month, the maximum electricity demand of the last month, the number of all trippings of the last month, the electricity demand of the furnace group, marks for the production status of each fused magnesium furnace, and the switch-off priority of each fused magnesium furnace.

The demand parameter adjustment data include: timestamp, alternate tripping set values of electricity demand of the furnace group after adjustment, and all tripping set values of electricity demand of the furnace group after adjustment;

In this implementation, the local PC of model Advantech IPC-610L is used for: receiving the basic monitoring data from the first slave computer according to the sampling cycle; taking the timestamp at the time of acquiring the basic monitoring data and the basic monitoring data as demand monitoring data, serializing the demand monitoring data through a lightweight data exchange format JSON (javaScript Object Notation) and sending the serialized data to the cloud server; receiving the serialized demand parameter adjustment data sent from the cloud server, deserializing the data through the lightweight data exchange format JSON (javaScript Object Notation) and sending the data to the first slave computer; and providing a local monitoring screen and displaying the demand monitoring data.

In this implementation, the local PC is provided with a local monitoring unit developed on the basis of JAVA language, which comprises a local monitoring module, a local data sending module and a local data receiving module.

In this implementation, the local monitoring module is used for taking the timestamp at the time of acquiring the basic monitoring data and the basic monitoring data as demand monitoring data, and sending the data to the local data sending module; sending the received demand parameter adjustment data to the first slave computer; and providing a local monitoring screen and displaying the demand monitoring data.

In this implementation, the local data sending module is used for serializing the demand monitoring data through the lightweight data exchange format JSON (javaScript Object Notation) and sending the serialized data to the cloud server through the Zookeeper technology.

In this implementation, the local data receiving module is used for deserializing the serialized demand parameter adjustment data through the lightweight data exchange format JSON (javaScript Object Notation) and sending the deserialized data to the local monitoring module.

In this implementation, the cloud server is used for: implementing data exchange between the local PC and the remote PC through the Zookeeper technology; receiving the serialized demand monitoring data sent from the local PC and sending the data to the remote PC; and receiving the serialized parameter adjustment data sent from the remote PC and sending the data to the local PC.

In this implementation, the cloud server comprises two Znode nodes: Znode node A and Znode node B, wherein Znode node A is used for sending the serialized demand monitoring data to the remote PC through the Zookeeper technology; and Znode node B is used for sending the serialized demand parameter adjustment data to the local PC through the Zookeeper technology.

In this implementation, the remote PC of model Dell Optiplex790 is used for deserializing the serialized demand monitoring data sent from the cloud server through the lightweight data exchange format JSON (javaScript Object Notation), providing a remote monitoring screen, displaying the demand monitoring data, serializing the demand parameter adjustment data through the lightweight data exchange format JSON (javaScript Object Notation) and sending the serialized data to the cloud server.

In this implementation, the remote PC is provided with a remote monitoring unit developed on the basis of the JAVA language, which comprises a remote monitoring module, a remote data sending module and a remote data receiving module.

In this implementation, the remote monitoring module is used for providing the remote monitoring screen, displaying the demand monitoring data, determining the demand parameter adjustment data, and sending the determined data to the remote data sending module.

In this implementation, the remote data sending module is used for serializing the demand parameter adjustment data through the lightweight data exchange format JSON (javaScript Object Notation) and sending the serialized demand parameter adjustment data to the cloud server through the Zookeeper technology.

In this implementation, the remote data receiving module is used for deserializing the serialized demand monitoring data through the lightweight data exchange format JSON (javaScript Object Notation) and then sending the data to the remote monitoring module.

Figure 3A:
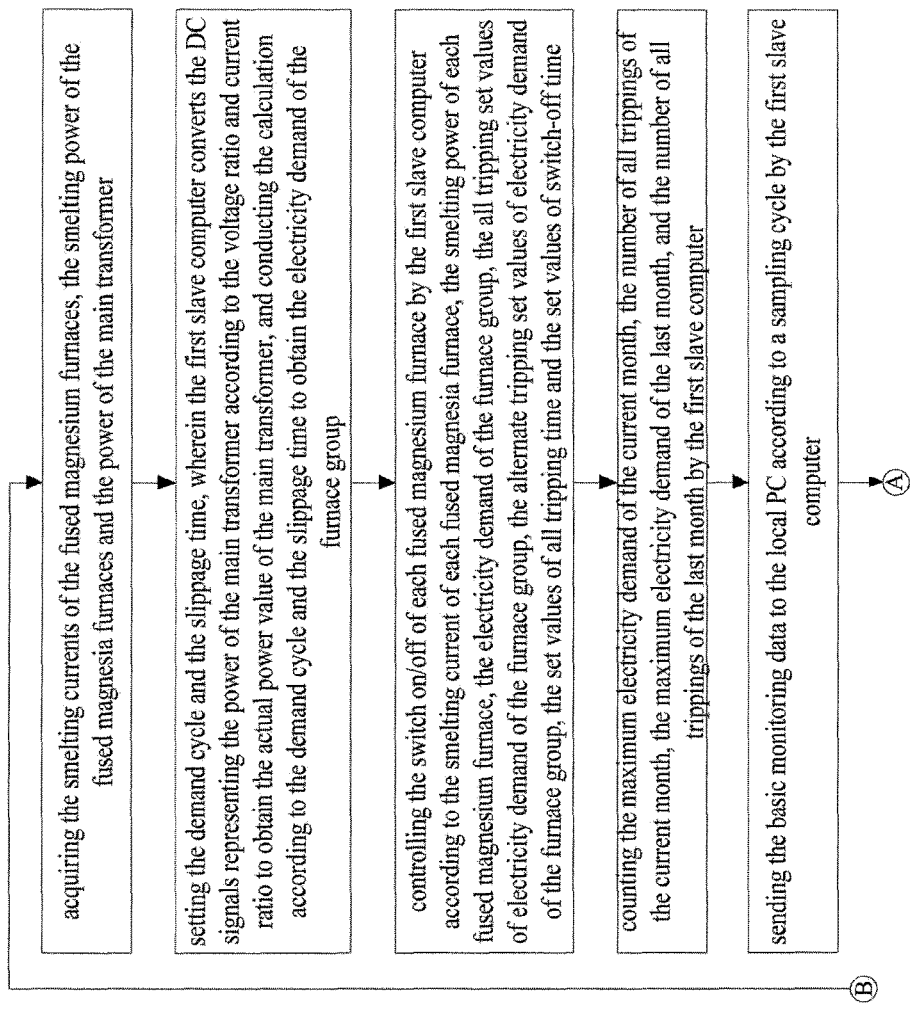
FIGS. 3A and 3B are a flow diagram of the remote monitoring method for electricity demand of a fused magnesium furnace group in detailed description of the present invention.
Figure 3B:
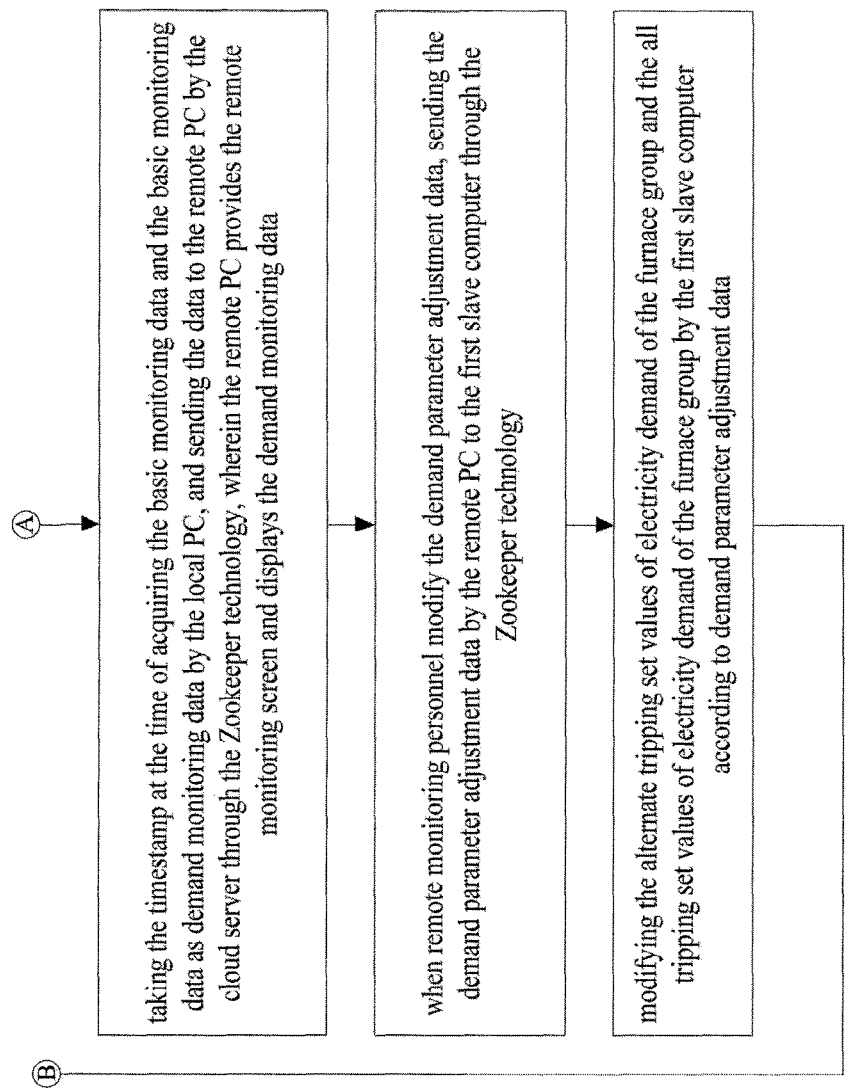
Figure 4A:
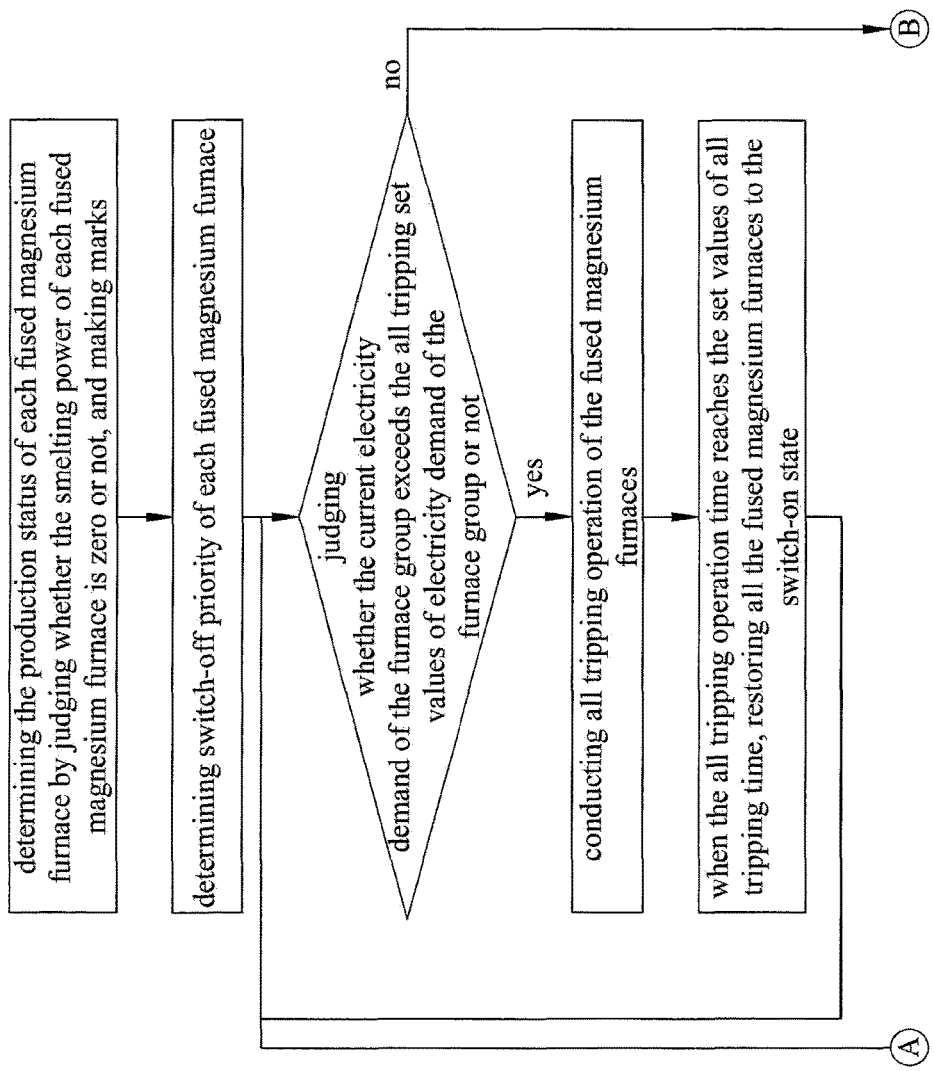
FIGS. 4A-4C a flow diagram of the first slave computer controlling the switch off/on of each fused magnesium furnace in detailed description of the present invention.
Figure 4B:
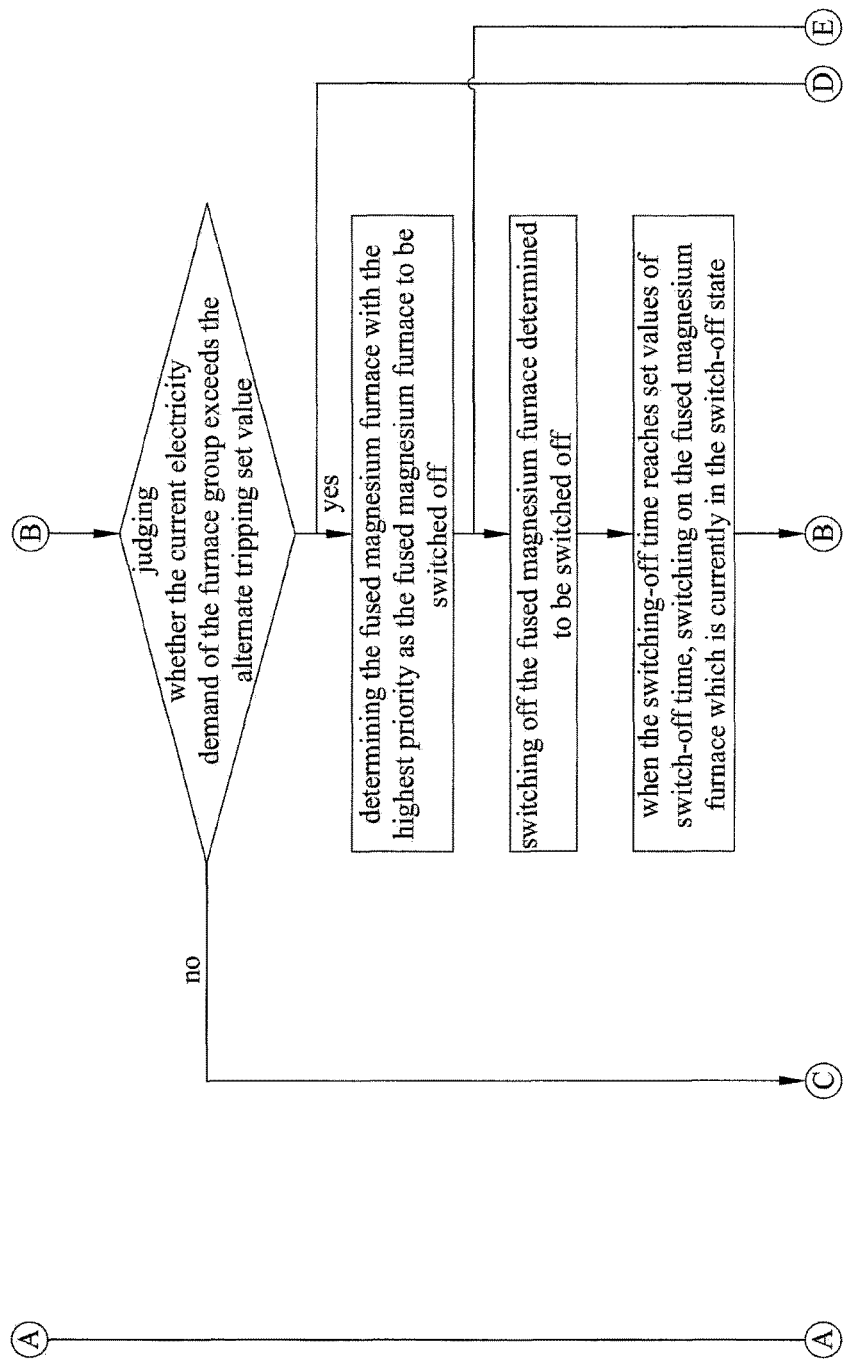
Figure 4C:
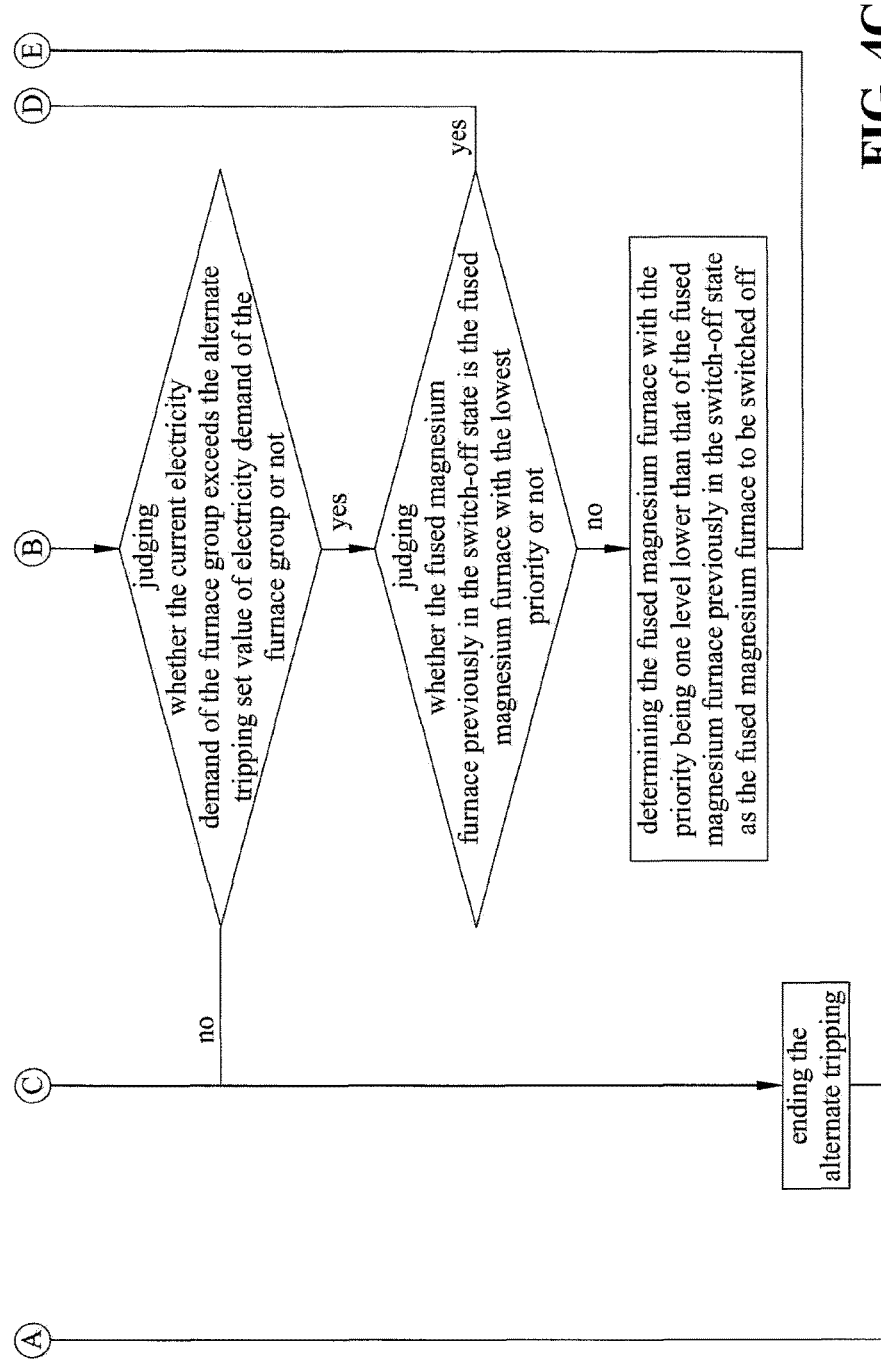

The remote monitoring method for electricity demand of the fused magnesium furnace group by using the remote monitoring system for electricity demand of the fused magnesium furnace group, as shown in FIGS. 3A and 3B, comprises the following steps:

step 1: acquiring the smelting current of each fused magnesium furnace, the smelting power of each fused magnesium furnace and the power of the main transformer;

step 1.1: acquiring the smelting current of the five fused magnesium furnaces and the smelting power of the five fused magnesium furnaces, and sending the smelting current and the smelting power to the Mitsubishi Q series PLC by the five multi-purpose electronic measuring instruments;

step 1.2: sending the smelting current of the five fused magnesium furnaces and the smelting power of the five fused magnesium furnaces by the Mitsubishi Q series PLC to the Siemens S7-200PLC;

step 1.3: converting the three-phase high-voltage AC signals on the secondary side of the main transformer of the fused magnesium furnace group into three-phase low-voltage AC signals (in the range of 0-110V) which can be received by the active power transducer according to a voltage ratio of 100:1, and sending the low-voltage AC signals to the active power transducer by the voltage transformer of model SZW3-10; converting the A and C two-phase high-current AC signals on the secondary side of the main transformer of the fused magnesium furnace group into A and C two-phase low-current AC signals (in the range of 0-5 A) which can be received by the active power transducer according to a current ratio of 400:1 by the current transformer of model LFZBJ-10, and sending the low-current AC signals to the active power transducer;

step 1.4: converting the three-phase low-voltage AC signals and the A and C two-phase low-current AC signals into DC signals (in the range of 4-20 mA) representing the power of the main transformer and sending the signals to the first slave computer by the three-phase three-wire active power transducer of model YDD-P3;

step 2: setting the demand cycle as 210 seconds, and the slippage time as 7 seconds. converting the DC signals representing the power of the main transformer by the Siemens S7-200PLC according to the voltage ratio of 100:1 and the current ratio of 400:1 to obtain the actual power value of the main transformer; and conducting the sliding average calculation on the actual power value of the main transformer with the demand cycle of 210 seconds and slippage time of 7 seconds, so as to obtain the electricity demand of the furnace group;

step 3: controlling the switch off/on of each fused magnesium furnace by the Siemens S7-200PLC according to the smelting current of the five fused magnesium furnaces, the smelting power of the five fused magnesium furnaces, the electricity demand of the furnace group, the all tripping set values of electricity demand of the furnace group, the alternate tripping set values of electricity demand of the furnace group, the set values of all tripping time and the set values of switch-off time, wherein in this implementation, the all tripping set value of electricity demand of the furnace group is 22500 kW, the alternate tripping set value of electricity demand of the furnace group is 21500 kW, the set value of all tripping time for electricity demand of the furnace group is 30 seconds, the set value of switch-off time is 30 seconds, and in this implementation, the process of controlling the switch off/on of each fused magnesium furnace as shown in FIGS. 4A-4C comprises the steps of:

step 3.1: determining the production status of each fused magnesium furnace by judging whether the smelting power of the five fused magnesium furnaces is zero or not, and making marks, wherein the fused magnesium furnace gets the production status mark of "ON" (that is, in the switch-on status) if the smelting power of such fused magnesium furnace is NOT zero, and the fused magnesium furnace gets the production status mark of "OFF" (that is, in the switch-off status) if the smelting power of such fused magnesium furnace is zero;

step 3.2: determining the switch-off priority of the five fused magnesium furnaces: arranging the switch-off priority of each fused magnesium furnace by comparing the sizes of the smelting current of the five fused magnesium furnaces, wherein the fused magnesium furnace with higher smelting current has higher priority. the fused magnesium furnace with the largest current having the level-1 switch-off priority, the fused magnesium furnace with the second largest current having the level-2 switch-off priority, the fused magnesium furnace with the third largest current having the level-3 switch-off priority, the fused magnesium furnace with the fourth largest current having the level-4 switch-off priority, and the fused magnesium furnace with the fifth largest current having the level-5 switch-off priority, among the five fused magnesium furnaces, the highest switch-off priority is the level-1 switch-off priority, and the lowest switch-off priority is the level-5 switch-off priority;

step 3.3: judging whether the current electricity demand of the furnace group exceeds the all tripping set value 22500 kW of electricity demand of the furnace group or not; if yes, conducting all tripping operation of the fused magnesium furnaces, that is, switching off all the fused magnesium furnaces and executing step 3.4; else, executing step 3.5;

step 3.4: when the all tripping operation time reaches the set value 30 seconds of all tripping time, restoring all the fused magnesium furnaces to the switch-on state and returning to step 3.3;

step 3.5: judging whether the current electricity demand of the furnace group exceeds the alternate tripping set value 21500 kW of electricity demand of the furnace group or not; if yes, executing step 3.6; else, executing step 3.12;

step 3.6: determining the fused magnesium furnace with the highest priority as the fused magnesium furnace to be switched off, and executing step 3.7;

step 3.7: switching off the fused magnesium furnace determined to be switched off;

step 3.8: when the switch-off time reaches the set value 30 seconds of switch-off time, switching on the fused magnesium furnace which is currently in the switch-off state;

step 3.9: judging whether the current electricity demand of the furnace group exceeds the alternate tripping set value 21500 kW of electricity demand of the furnace group or not; if yes, executing step 3.10; else, executing step 3.12;

step 3.10: judging whether the fused magnesium furnace previously in the switch-off state is the fused magnesium furnace with the lowest priority or not; if yes, returning to step 3.6; else, executing step 3.11;

step 3.11: determining the fused magnesium furnace with the priority being one level lower than that of the fused magnesium furnace previously in the switch-off state as the fused magnesium furnace to be switched off, and returning to step 3.7;

step 3.12: ending the alternate tripping, and returning to step 3.3;

step 4: counting the maximum electricity demand of the current month, the number of all trippings of the current month, the maximum electricity demand of the last month, and the number of all trippings of the last month by the first slave computer;

step 5: sending the basic monitoring data to the local PC by the first slave computer according to a sampling cycle of 3 seconds;

step 6: taking the timestamp at the time of acquiring the basic monitoring data and the basic monitoring data as demand monitoring data by the local PC, and sending the data to the remote PC by the cloud server through the Zookeeper technology, wherein the remote PC provides the remote monitoring screen and displays the demand monitoring data, wherein in this implementation, the process of the local PC sending the serialized demand monitoring data to the remote PC via Znode node A of the cloud server, as shown in FIG. 5, comprises the steps of:

step 6.1: taking the timestamp at the time of acquiring the basic monitoring data and the basic monitoring data as demand monitoring data, sending the data to the local data sending module, while providing the local monitoring screen and displaying the demand monitoring data by the local monitoring module;

step 6.2: serializing the demand monitoring data through the lightweight data exchange format JSON (javaScript Object Notation) and sending the serialized demand monitoring data by the local data sending module to Znode node A of the cloud server through the Zookeeper technology;

step 6.3: reading the serialized demand monitoring data by the remote data receiving module from Znode node A of the cloud server through the Zookeeper technology;

step 6.4: deserializing the serialized demand monitoring data through the lightweight data exchange format JSON (javaScript Object Notation), and sending the deserialized data to the remote monitoring module by the remote data receiving module;

step 6.5: providing a remote monitoring screen, and displaying the demand monitoring data by the remote monitoring module, wherein in this implementation, the demand monitoring data in the sampling cycle of 3 seconds are shown in Table 1:

TABLE 1

Demand Monitoring Data during One Sampling Cycle

| Variable | Description |
| --- | --- |
| Jun 5, 2014, 3:58:49 AM | timestamp |
| 100 | voltage ratio |
| 400 | current ratio |
| 210 | demand cycle (sec) |
| 7 | slippage time (sec) |
| 19932 | power of main transformer (kW) |
| 19667 | electricity demand of furnace group (kW) |
| 21500 | alternate tripping set value of electricity demand of furnace group (kW) |
| 22500 | all tripping set value of electricity demand of furnace group (kW) |
| 21232 | maximum electricity demand of current month (kW) |
| 21136 | maximum electricity demand of last month (kW) |
| 3 | number of all trippings of current month |
| 7 | number of all trippings of last month |
| 16252 | smelting current of 1# fused magnesium furnace (A) |
| 13444 | smelting current of 2# fused magnesium furnace (A) |
| 13828 | smelting current of 3# fused magnesium furnace (A) |
| 13292 | smelting current of 4# fused magnesium furnace (A) |
| 13004 | smelting current of 5# fused magnesium furnace (A) |
| 4639 | smelting power of 1# fused magnesium furnace (kW) |
| 3837 | smelting power of 2# fused magnesium furnace (kW) |
| 3948 | smelting power of 3# fused magnesium furnace (kW) |
| 3795 | smelting power of 4# fused magnesium furnace (kW) |
| 3713 | smelting power of 5# fused magnesium furnace (kW) |
| ON | production status mark of 1# fused magnesium furnace |
| ON | production status mark of 2# fused magnesium furnace |
| ON | production status mark of 3# fused magnesium furnace |
| ON | production status mark of 4# fused magnesium furnace |
| ON | production status mark of 5# fused magnesium furnace |
| 1 | switch-off priority of 1# fused magnesium furnace |
| 3 | switch-off priority of 2# fused magnesium furnace |
| 2 | switch-off priority of 3# fused magnesium furnace |
| 4 | switch-off priority of 4# fused magnesium furnace |
| 5 | switch-off priority of 5# fused magnesium furnace | step 7: when remote monitoring personnel modify the demand parameter adjustment data, sending the demand parameter adjustment data by the remote PC to the first slave computer through the Zookeeper technology, wherein in this implementation, the process of the remote PC sending the serialized demand parameter adjustment data to the remote PC via Znode node B of the cloud server through the Zookeeper technology, as shown in FIG. 6, comprises the steps of:

step 7.1: when remote monitoring personnel modify the demand parameter adjustment data, sending the demand parameter adjustment data by the remote monitoring module to the remote data sending module, wherein in this implementation, the demand parameter adjustment data that the remote monitoring personnel modify based on their experience during one sampling cycle are shown in Table 2:

TABLE 2

Demand Parameter Adjustment Data during One Sampling Cycle

| Data type | Description |
|---|---|
| Jun 5, 2014, 04:03:08 AM | timestamp |
| 21600 kW | alternate tripping set value of electricity demand of furnace group after adjustment |
| 22490 kW | all tripping set value of electricity demand of furnace group after adjustment | step 7.2: serializing the demand parameter adjustment data through the lightweight data exchange format JSON (javaScript Object Notation) and sending the serialized demand parameter adjustment data by the remote data sending module to Znode node of the cloud server through the Zookeeper technology;

step 7.3: reading the serialized demand parameter adjustment data by the local data receiving module from Znode node B of the cloud server through the Zookeeper technology;

step 7.4: deserializing the serialized demand parameter adjustment data through the lightweight data exchange format JSON (javaScript Object Notation), and sending the deserialized data to the local monitoring module by the local data receiving module;

step 7.5: sending the demand parameter adjustment data by the local monitoring module to the first slave computer; and step 8: modifying the alternate tripping set values of electricity demand of the furnace group and the all tripping set values of electricity demand of the furnace group by the first slave computer according to demand parameter adjustment data, and returning to step 1.

The present invention realizes the convenience for enterprise management personnel and scientific research personnel to conduct long-distance monitoring on the electricity demand of the fused magnesium furnace group in order to carry out production guidance, and guarantees the smelting process and the safety of the electric network under the condition of not exceeding the maximum allowable demand.

What is claimed is:

1. A remote monitoring system for electricity demand of a fused magnesium furnace group, the remote monitoring system comprising:
   a data acquisition device;
   a local PC;
   a cloud server; and
   a remote PC,
   wherein:
   the data acquisition device comprises a voltage transformer, a current transformer, an active power transducer, a first slave computer, a plurality of multi-purpose electronic measuring instruments and a second slave computer;
   the voltage transformer and the current transformer are mounted in a substation, output ends of the voltage transformer and output ends of the current transformer are connected with input ends of the active power transducer, and an output end of the active power transducer is connected with an input end of the first slave computer;
   the multi-purpose electronic measuring instruments are mounted in the substation, an output end of each multi-purpose electronic measuring instrument is connected with an input end of the second slave computer, an output end of the second slave computer is connected with an input end of the first slave computer, an output end of the first slave computer is connected with the local PC and is also connected with switch-off relays of the fused magnesium furnaces, the local PC is connected with the cloud server through the Internet, and the cloud server is connected with the remote PC through the Internet;
   the local PC is used for:
     receiving basic monitoring data from the first slave computer according to a sampling cycle;
     taking a timestamp at the time of acquiring the basic monitoring data and the basic monitoring data as demand monitoring data, serializing the demand monitoring data, and sending the serialized data to the cloud server;
     receiving the serialized demand parameter adjustment data sent from the cloud server, deserializing the data, and sending the deserialized data to the first slave computer; and
     providing a local monitoring screen and displaying the demand monitoring data;
   the cloud server is used for:
     implementing data exchange between the local PC and the remote PC through a Zookeeper technology;
     receiving the serialized demand monitoring data sent from the local PC and sending the data to the remote PC; and
     receiving the serialized parameter adjustment data sent from the remote PC and sending the data to the local PC; and
   the remote PC is used for deserializing the serialized demand monitoring data sent from the cloud server, providing a remote monitoring screen, displaying the demand monitoring data, serializing the demand parameter adjustment data and sending the serialized data to the cloud server.

2. The remote monitoring system for electricity demand of a fused magnesium furnace group according to claim 1, wherein:
   the voltage transformer is used for converting three-phase high-voltage AC signals on the secondary side of a main transformer of the fused magnesium furnace group into three-phase low-voltage AC signals which can be received by the active power transducer according to a voltage ratio, and sending the low-voltage AC signals to the active power transducer;
   the current transformer is used for converting A and C two-phase high-current AC signals on the secondary side of the main transformer of the fused magnesium furnace group into A and C two-phase low-current AC signals which can be received by the active power transducer according to a current ratio, and sending the signals to the active power transducer;
   the active power transducer is used for converting the three-phase low-voltage AC signals and the A and C two-phase low-current AC signals into DC signals representing the power of the main transformer and sending the signals to the first slave computer;

the multi-purpose electronic measuring instruments are used for acquiring the smelting current of each fused magnesium furnace and the smelting power of each fused magnesium furnace, and sending the smelting current and the smelting power to the second slave computer;

the second slave computer is used for sending the smelting current of each fused magnesium furnace and the smelting power of each fused magnesium furnace to the first slave computer; and the first slave computer is used for:
  setting a demand cycle, slippage time, alternate tripping set values of electricity demand of the furnace group and all tripping set values of electricity demand of the furnace group;
  converting the DC signals representing the power of the main transformer according to the voltage ratio and the current ratio so as to obtain the actual power value of the main transformer;
  conducting sliding average calculation during the demand cycle according to the actual power value of the main transformer, so as to obtain electricity demand of the furnace group, and re-calculating once every other slippage time to obtain new electricity demand of the furnace group;
  determining the production status of each fused magnesium furnace by checking whether the smelting power of each fused magnesium furnace is zero or not, and making marks;
  arranging the switch-off priority of each fused magnesium furnace by comparing the sizes of the smelting current of the fused magnesium furnaces;
  counting the maximum electricity demand of the current month, the number of all trippings of the current month, the maximum electricity demand of the last month, and the number of all trippings of the last month;
  sending basic monitoring data to the local PC according to the sampling cycle; controlling the switch off/on of each fused magnesium furnace according to the smelting current of each fused magnesium furnace, the smelting power of each fused magnesium furnace, the electricity demand of the furnace group, the all tripping set values of electricity demand of the furnace group, the alternate tripping set values of electricity demand of the furnace group, set values of all tripping time and set values of switch-off time; and
  modifying the alternate tripping set values of electricity demand of the furnace group and all tripping set values of electricity demand of the furnace group according to demand parameter adjustment data.

3. The remote monitoring system for electricity demand of a fused magnesium furnace group according to claim 1, wherein, the basic monitoring data include: the power of the main transformer, the smelting current of each fused magnesium furnace, the smelting power of each fused magnesium furnace, the voltage ratio, the current ratio, the demand cycle, the slippage time, the alternate tripping set values of electricity demand of the furnace group, the all tripping set values of electricity demand of the furnace group, the maximum electricity demand of the current month, the number of all trippings of the current month, the maximum electricity demand of the last month, the number of all trippings of the last month, the electricity demand of the furnace group, marks for the production status of each fused magnesium furnace, and the switch-off priority of each fused magnesium furnace.

4. The remote monitoring system for electricity demand of a fused magnesium furnace group according to claim 1, wherein, the demand parameter adjustment data include: a timestamp, alternate tripping set values of electricity demand of the furnace group after adjustment, and all tripping set values of electricity demand of the furnace group after adjustment.

5. The remote monitoring system for electricity demand of a fused magnesium furnace group according to claim 1, wherein, the local PC is provided with a local monitoring unit which comprises a local monitoring module, a local data sending module and a local data receiving module,
  wherein:
  the local monitoring module is used for:
    taking the timestamp at the time of acquiring the basic monitoring data and the basic monitoring data as demand monitoring data, and sending the data to the local data sending module;
    sending the received demand parameter adjustment data to the first slave computer; and
    providing a local monitoring screen and displaying the demand monitoring data;
  the local data sending module is used for serializing the demand monitoring data and sending the serialized data to the cloud server through a Zookeeper technology; and
  the local data receiving module is used for deserializing the serialized demand parameter adjustment data and sending the deserialized data to the local monitoring module.

6. The remote monitoring system for electricity demand of a fused magnesium furnace group according to claim 1, wherein, the cloud server comprises:
  two Znode nodes, Znode node A and Znode node B,
  wherein:
  Znode node A is used for sending the serialized demand monitoring data to the remote PC through the Zookeeper technology; and
  Znode node B is used for sending the serialized demand parameter adjustment data to the local PC through the Zookeeper technology.

7. The remote monitoring system for electricity demand of a fused magnesium furnace group according to claim 1, wherein, the remote PC is provided with a remote monitoring unit which comprises a remote monitoring module, a remote data sending module and a remote data receiving module,
  wherein:
  the remote monitoring module is used for providing the remote monitoring screen, displaying the demand monitoring data, determining the demand parameter adjustment data, and sending the determined the data to the remote data sending module;
  the remote data sending module is used for serializing the demand parameter adjustment data and sending the serialized demand parameter adjustment data to the cloud server through the Zookeeper technology; and
  the remote data receiving module is used for deserializing the serialized demand monitoring data and then sending the data to the remote monitoring module.

8. A remote monitoring method for electricity demand of the fused magnesium furnace group by using the remote monitoring system for electricity demand of the fused magnesium furnace group according to claim 1, the remote monitoring method comprising the following steps:

step 1: acquiring the smelting current of each fused magnesium furnace, the smelting power of each fused magnesium furnace and the power of the main transformer;

step 1.1: acquiring the smelting current of each fused magnesium furnace and the smelting power of each fused magnesium furnace, and sending the smelting current and the smelting power to the second slave computer by the multi-purpose electronic measuring instruments;

step 1.2: sending the smelting current of each fused magnesium furnace and the smelting power of each fused magnesium furnace to the first slave computer by the second slave computer;

step 1.3: converting the three-phase high-voltage AC signals on the secondary side of the main transformer of the fused magnesium furnace group into three-phase low-voltage AC signals which can be received by the active power transducer by the voltage transformer according to a voltage ratio; converting the A and C two-phase high-current AC signals on the secondary side of the main transformer of the fused magnesium furnace group into A and C two-phase low-current AC signals which can be received by the active power transducer by the voltage transformer according to a current ratio; sending the low-voltage AC signals and low-current AC signals to the active power transducer;

step 1.4: converting the three-phase low-voltage AC signals and the A and C two-phase low-current AC signals into DC signals representing the power of the main transformer and sending the signals to the first slave computer by the active power transducer;

step 2: setting the demand cycle and the slippage time, wherein the first slave computer converts the DC signals representing the power of the main transformer according to the voltage ratio and current ratio to obtain the actual power value of the main transformer, and conducting the calculation according to the demand cycle and the slippage time to obtain the electricity demand of the furnace group;

step 3: controlling the switch off/on of each fused magnesium furnace by the first slave computer according to the smelting current of each fused magnesium furnace, the smelting power of each fused magnesium furnace, the electricity demand of the furnace group, the all tripping set values of electricity demand of the furnace group, the alternate tripping set values of electricity demand of the furnace group, the set values of all tripping time and the set values of switch-off time;

step 4: counting the maximum electricity demand of the current month, the number of all trippings of the current month, the maximum electricity demand of the last month, and the number of all trippings of the last month by the first slave computer;

step 5: sending the basic monitoring data to the local PC by the first slave computer according to a sampling cycle;

step 6: taking the timestamp at the time of acquiring the basic monitoring data and the basic monitoring data as demand monitoring data by the local PC, and sending the data to the remote PC by the cloud server through the Zookeeper technology, wherein the remote PC provides the remote monitoring screen and displays the demand monitoring data;

step 7: when remote monitoring personnel modify the demand parameter adjustment data, sending the demand parameter adjustment data to the first slave computer by the remote PC through the Zookeeper technology; and step 8: modifying the alternate tripping set values of electricity demand of the furnace group and the all tripping set values of electricity demand of the furnace group by the first slave computer according to demand parameter adjustment data, and returning to step 1.

9. The remote monitoring method for electricity demand of the fused magnesium furnace group according to claim 8, wherein, step 3 comprises the following steps:

step 3.1: determining the production status of each fused magnesium furnace by judging whether the smelting power of each fused magnesium furnace is zero or not, and making marks;

step 3.2: determining the switch-off priority of each fused magnesium furnace: arranging the switch-off priority of each fused magnesium furnace by comparing the sizes of the smelting currents of the fused magnesium furnaces, wherein the fused magnesium furnace with higher smelting current has higher priority;

step 3.3: judging whether the current electricity demand of the furnace group exceeds the all tripping set values of electricity demand of the furnace group or not; if yes, conducting all tripping operation of the fused magnesium furnaces, that is, switching off all the fused magnesium furnaces and executing step 3.4; else, executing step 3.5;

step 3.4: when the all tripping operation time reaches the set values of all tripping time, restoring all the fused magnesium furnaces to the switch-on state and returning to step 3.3;

step 3.5: judging whether the current electricity demand of the furnace group exceeds the alternate tripping set values of electricity demand of the furnace group or not; if yes, executing step 3.6; else, executing step 3.12;

step 3.6: determining the fused magnesium furnace with the highest priority as the fused magnesium furnace to be switched off, and executing step 3.7;

step 3.7: switching off the fused magnesium furnace determined to be switched off;

step 3.8: when the switching-off time reaches set values of switch-off time, switching on the fused magnesium furnace which is currently in the switch-off state;

step 3.9: judging whether the current electricity demand of the furnace group exceeds the alternate tripping set values of electricity demand of the furnace group or not; if yes, executing step 3.10; else, executing step 3.12;

step 3.10: judging whether the fused magnesium furnace previously in the switch-off state is the fused magnesium furnace with the lowest priority or not; if yes, returning to step 3.6; else, executing step 3.11;

step 3.11: determining the fused magnesium furnace with the priority being one level lower than that of the fused magnesium furnace previously in the switch-off state as the fused magnesium furnace to be switched off, and returning to step 3.7; and step 3.12: ending the alternate tripping, and returning to step 3.3.

* * * * *